United States Patent [19]

Wyland

[11] 4,307,379

[45] Dec. 22, 1981

[54] INTEGRATED CIRCUIT COMPONENT

[75] Inventor: David C. Wyland, San Jose, Calif.

[73] Assignee: Raytheon Company, Lexington, Mass.

[21] Appl. No.: 67,660

[22] Filed: Aug. 20, 1979

Related U.S. Application Data

[63] Continuation of Ser. No. 850,185, Nov. 10, 1977, abandoned.

[51] Int. Cl.³ ............................................... H04Q 3/00
[52] U.S. Cl. ............................ 340/825.83; 340/825.86
[58] Field of Search ........ 340/166 R, 147 R, 147 CN; 365/96; 307/243

[56] References Cited

U.S. PATENT DOCUMENTS

| | | | |
|---|---|---|---|
| 3,611,319 | 10/1971 | Hyatt | 365/96 |
| 3,668,655 | 6/1972 | Allen | 365/96 |
| 3,721,964 | 3/1973 | Barrett | 340/166 X |
| 3,976,983 | 8/1976 | Moussie | 365/96 |
| 4,056,807 | 11/1977 | Thornber | 340/166 R |
| 4,091,359 | 5/1978 | Rossler | 340/166 R |

Primary Examiner—Harold I. Pitts
Attorney, Agent, or Firm—Richard M. Sharkansky; Joseph D. Pannone

[57] ABSTRACT

An integrated circuit component having an array of rows and columns of programmable coupling elements, the rows being coupled to a plurality of independent input signals and the columns being coupled to output ports through a plurality of selectors. With such circuit component the independent input signals may be selectively coupled to the output ports in accordance with the programmed state of the programmable coupling elements and in accordance with control signals fed to the selectors. Therefore, if it is desired to change the coupling of the input signals to the output ports for the given control signal a different circuit component having differently programmed coupling elements may replace the previously programmed circuit component without requiring changes to printed circuit board connectors.

2 Claims, 13 Drawing Figures

| FUNCTION | SELECT CODE | | | COMPONENT $10_1$ | | | | COMPONENT $10_2$ | | | | COMPONENT $10_3$ | | | | COMPONENT $10_4$ | | | |
|---|---|---|---|---|---|---|---|---|---|---|---|---|---|---|---|---|---|---|---|
| | $S_2$ | $S_1$ | $S_0$ | $O_1$ | $O_2$ | $O_3$ | $O_4$ | $O_1$ | $O_2$ | $O_3$ | $O_4$ | $O_1$ | $O_2$ | $O_3$ | $O_4$ | $O_1$ | $O_2$ | $O_3$ | $O_4$ |
| DATA (UNALTERED) | 0 | 0 | 0 | $B_{15}$ | $B_{14}$ | $B_{13}$ | $B_{12}$ | $B_{11}$ | $B_{10}$ | $B_9$ | $B_8$ | $B_7$ | $B_6$ | $B_5$ | $B_4$ | $B_3$ | $B_2$ | $B_1$ | $B_0$ |
| DATA, FORCE SIGN BIT ZERO | 0 | 0 | 1 | 0 | $B_{14}$ | $B_{13}$ | $B_{12}$ | $B_{11}$ | $B_{10}$ | $B_9$ | $B_8$ | $B_7$ | $B_6$ | $B_5$ | $B_4$ | $B_3$ | $B_2$ | $B_1$ | $B_0$ |
| BYTE SWAP | 0 | 1 | 0 | $B_7$ | $B_6$ | $B_5$ | $B_4$ | $B_3$ | $B_2$ | $B_1$ | $B_0$ | $B_{15}$ | $B_{14}$ | $B_{13}$ | $B_{12}$ | $B_{11}$ | $B_{10}$ | $B_9$ | $B_8$ |
| BYTE, SIGN EXTENDED | 0 | 1 | 1 | $B_7$ | $B_7$ | $B_7$ | $B_7$ | $B_7$ | $B_7$ | $B_7$ | $B_7$ | $B_7$ | $B_6$ | $B_5$ | $B_4$ | $B_3$ | $B_2$ | $B_1$ | $B_0$ |
| LO BYTE, UPPER 8 BITS ZERO | 1 | 0 | 0 | 0 | 0 | 0 | 0 | 0 | 0 | 0 | 0 | $B_7$ | $B_6$ | $B_5$ | $B_4$ | $B_3$ | $B_2$ | $B_1$ | $B_0$ |
| HIGH BYTE UPPER BITS ZERO | 1 | 0 | 1 | 0 | 0 | 0 | 0 | 0 | 0 | 0 | 0 | $B_{15}$ | $B_{14}$ | $B_{13}$ | $B_{12}$ | $B_{11}$ | $B_{10}$ | $B_9$ | $B_8$ |
| 16 BIT DATA CONSTANT | 1 | 1 | 0 | 1 | 0 | 1 | 1 | 1 | 1 | 1 | 1 | 16 BIT DATA 0 | 0 | 0 | 1 | 0 | 1 | 0 | 0 | 1 | 0 |
| (SPARE) | 1 | 1 | 1 | | | | | SPARE | | | | | | | | | | | |

INTEGRATED CIRCUIT COMPONENT

CROSS-REFERENCE TO RELATED CASES

This is a continuation of application Ser. No. 850,185, filed Nov. 10, 1977, now abandoned.

BACKGROUND OF THE INVENTION

This invention relates generally to integrated circuit components and, more particularly, to integrated circuit components adapted for use in digital systems.

As is known in the art, digital apparatus is generally made up for a number of interconnected integrated circuit components, such as, for example, counter, shift/storage registers, decoders/multiplexers, read only memories, random access memories, arithmetic units and microprocessors. These components are generally affixable to socket type connectors, such connectors being interconnected by a printed circuit board. One of the components, the decoder/multiplexer, is generally used to route binary input signals coupled to the input ports of such component to selected output ports of the component selectively in accordance with a control signal fed to the component. That is, for a particular decoder/multiplexer, a fixed predetermined relationship exists between the control signals and the manner of routing the input signals to the output ports. If it is necessary to change the relationship, that is, route the input signals to different output ports in response to the same control signals, then rewiring of the printed circuit board is required and such is a relatively expensive process.

As is also known in the art, another integrated circuit component, the programmable read only memory (PROM), includes a programmable diode matrix fed by a decoder to address each row of the matrix. That is, each row of the matrix corresponds to a memory address, such row or address being programmed to store a digital word. The memory is addressed by a digital word which is fed to the decoder. The decoder, in response to such digital word, enables or selects a corresponding one of the rows of the matrix which is then read from the memory. While such integrated circuit component has been found satisfactory for use as a memory, such component is not practical for routing input signals described above because, for example, if it is desired to selectively route ten input signals over one thousand rows would be required for the matrix. Further, because the decoder includes pairs of inverters for producing "true" and "complement" signals, erroneous transient signals, sometimes referred to as glitches, may be produced when the component is required to operate with high input data rates because the "true" and "complement" signals do not switch simultaneously.

SUMMARY OF THE INVENTION

With this background of the invention in mind, it is therefore an object of this invention to provide an improved integrated circuit component adapted to route input signals to output terminals selectively in accordance with control signals.

This and other objects of the invention are attained generally by providing an integrated circuit component comprising: An array of conductors arranged in rows and columns; a plurality of programmable coupling elements for selectively coupling or decoupling selected rows and columns of conductors selectively in accordance with the programmed state of the programmable coupling elements; means for coupling each one of a plurality of independent input signals to a corresponding one of the rows of conductors; selector means for coupling one of the plurality of columns of conductors to an output terminal selectively in accordance with a control signal; and a single crystal body having formed thereon the array of conductors; the programmable coupling elements, the coupling means and the selector means.

In a preferred embodiment of the invention, the programmable coupling elements include fusible links. Each row of the conductors is adapted for coupling to a corresponding one of the plurality of input signals by an inverter. A different selector means is coupled to a corresponding portion of the columns of conductors. A programming circuit, formed on the single crystal body, is coupled to the selector means for enabling programming of the fusible links.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENT

Figures 1, 1A:
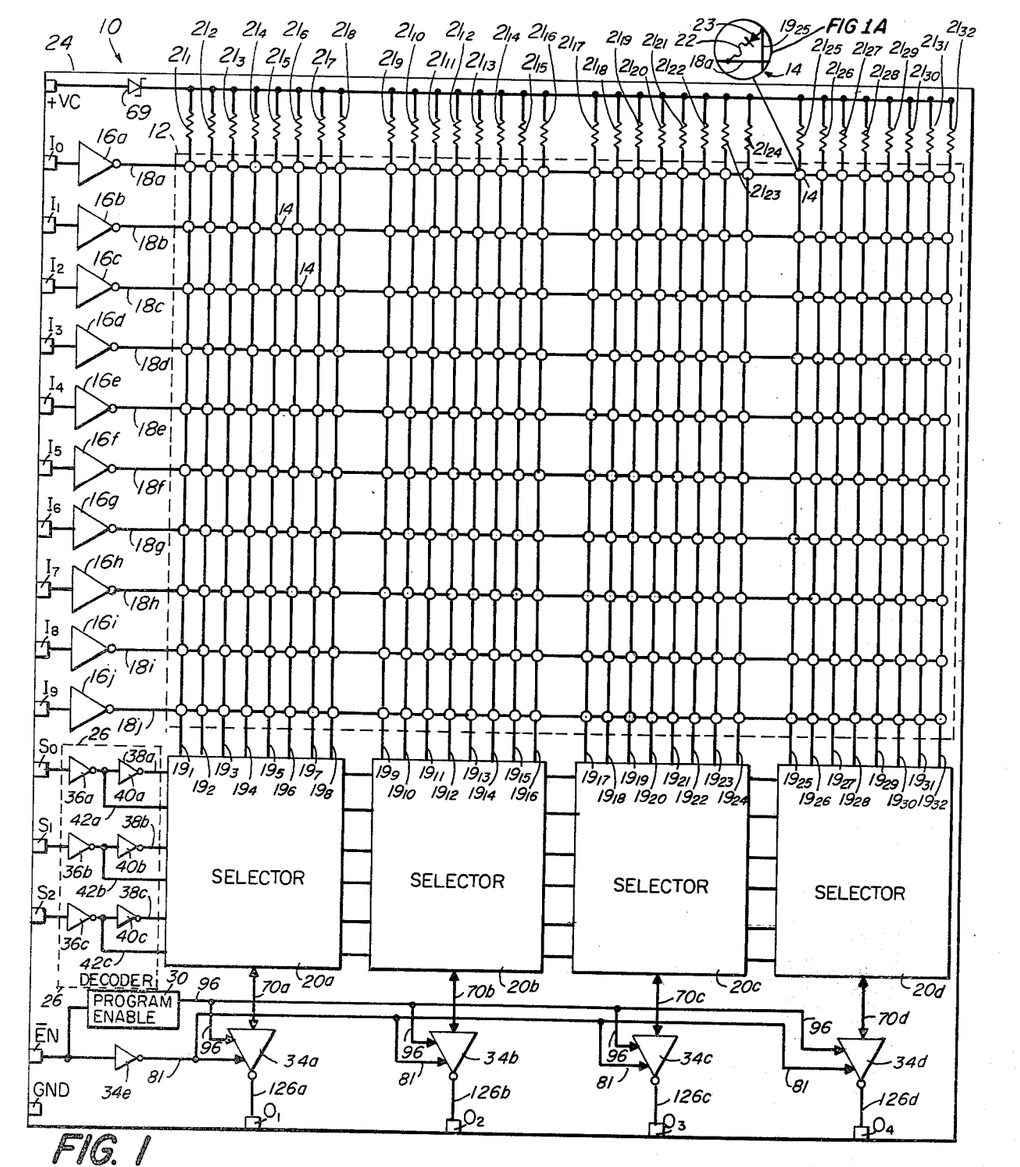
FIG. 1 is a block diagram of an integrated circuit component in accordance with the invention.
FIG. 1A is a diagram showing an exemplary programmable coupling element used in the integrated circuit component shown in FIG. 1.

Referring now to FIG. 1, an integrated circuit component 10 is shown to include: An array 12 of rows and columns of programmable coupling elements 14; a plurality of, here ten, inverters $16a-16j$, for coupling each one of a like plurality of input signals coupled to input pads $I_0-I_9$ to a corresponding one of the rows of programmable coupling elements 14; selectors $20a-20d$ for coupling the columns of coupling elements 14 to output pads $O_1-O_4$ selectively in response to control signals applied to control signal pads $S_0-S_2$; a program enable circuit 30 coupled to the array 12 through selectors $20a-20d$ for enabling programming of the array 12; and a single crystal substrate 24, here silicon, having formed thereon the array 12, the inverters $16a-16j$, selectors $20a-20d$, the program enable circuit 30, input pads $I_0-I_9$, output pads $O_1-O_4$ and control signal pads $S_0-S_2$, using conventional integrated circuit processing.

The array 12 here includes: ten rows of conductors $18a-18j$, each one of such conductors being coupled to the output of a corresponding one of the inverters $16a-16j$, as shown; and thirty-two columns of conductors $19_1-19_{32}$, each one of such conductors $19_1-19_{32}$ being coupled to a $+V_c$ pad through a corresponding one of resistors $21_1-21_{32}$, and a Schottky diode 69, as shown. (The $+V_c$ pad is adapted for coupling the integrated circuit component 10 to a suitable $+V_c$ power supply, not shown. Likewise, a ground pad, GND, is adapted for coupling the integrated circuit component 10 to the ground potential of such power supply.) The array 12 is divided into, here, four sections, conductors $19_1-19_8$ being coupled to selector $20a$, conductors $19_9-19_{16}$ being coupled to selectors $20b$, conductors $19_{17}-19_{24}$ being coupled to selectors $20c$, and conductors $19_{25}-19_{32}$ being coupled to selector $20d$, as shown.

Each one of the programmable coupling elements 14 is identical in construction, an exemplary one thereof being shown in detail in FIG. 1A. Such coupling element includes a fusible link 22 and diode 23 serially connected between crossing row conductors $18a-18j$ and column conductors $19_1-19_{32}$. That is, considering the exemplary coupling element 14 shown in FIG. 1A, such element is connected between row conductors $18a$ and column conductors $19_{25}$, as shown. It follows, then, that array 12 here includes 320 coupling elements arranged in four, $8 \times 10$ matrices.

Figure 2:
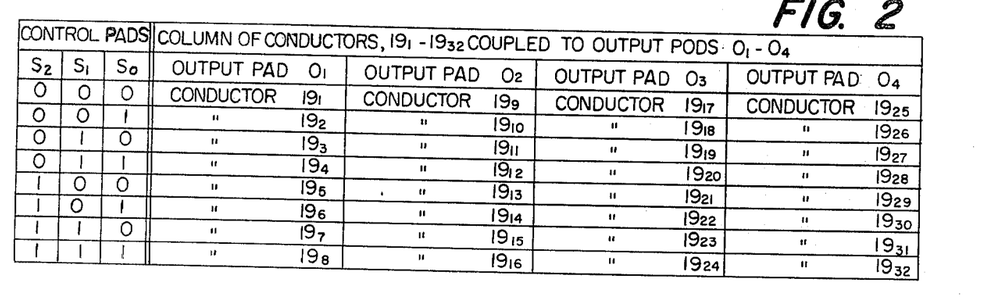
FIG. 2 is a table useful in understanding the integrated circuit components shown in FIG. 1.

Selectors $20a-20d$ are coupled to control pads $S_0-S_2$ through decoder 26 and to corresponding ones of output pads $O_1-O_4$ through inverters $34a-34c$, as shown. Decoder 26 is of conventional design and includes inverters $36a-36c$ coupled to control pads $S_0-S_2$, respectively, as shown; "true" lines $38a-38c$ coupled to inverters $36a-36c$ via inverters $40a-40c$, respectively, as shown; and "complement" lines $42a-42c$ coupled to the outputs of inverters $36a-36c$, respectively, as shown. It follows, then, that "true" and "complement" signals of the control signals fed to control pads $S_0-S_2$ are produced on lines $38a$, $42a$; $38b$, $42b$; and $38c$, $42c$, respectively. When enabled for normal operation, an enable signal (here a low voltage signal, i.e., $\sim 0-+0.3$ volt) is applied to enable pad $\overline{EN}$. Such enable signal is fed, inter alia, to inverters $34a-34d$ via inverter $34e$, thereby enabling selector $20a$ to couple one of the columns of conductors $19_1-19_8$ to output pad $O_1$ via inverter $34a$; selector $20b$ to couple one of the columns of conductors $19_9-19_{16}$ to output pad $O_2$ via inverter $34b$; selector $20c$ to couple one of the columns of conductors $19_{17}-19_{24}$ to output pad $O_3$ via inverter $34c$; and selector $20d$ to couple one of the conductors $19_{25}-19_{32}$ to output pad $O_4$ via inverter $34d$, such selected ones of conductors $19_1-19_{32}$ being coupled to such output pads $O_1-O_4$ in accordance with the control signals on control pads $S_0-S_2$. The relationship is shown in FIG. 2 where logical 0 is a low voltage signal and logical 1 is a high voltage (i.e., $\sim 5$ volts) signal. (The decoder 26 and inverters $34a-34e$ are also formed on substrate 24 using conventional integrated circuit processing techniques).

Figure 3:
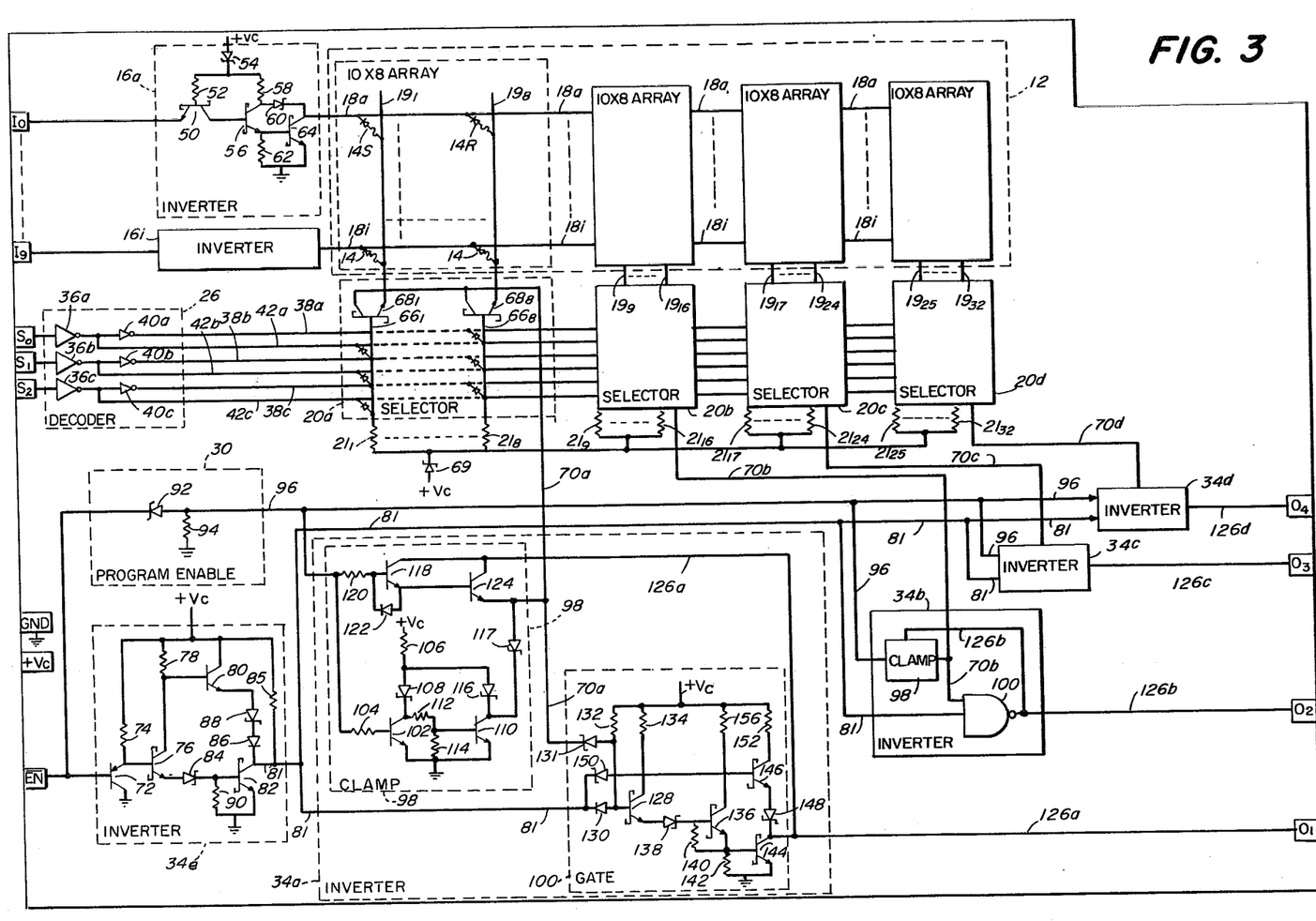
FIG. 3 is a schematic diagram of the integrated circuit component shown in FIG. 1.

Referring now also to FIG. 3, the integrated circuit component 10 is shown; here, however, the selectors $20a-20d$ are shown coupled between the resistors $21_1-21_{32}$ and the array 12, whereas in FIG. 1 the array 12 is shown coupled between the selectors $20a-20d$ and resistors $21_1-21_{32}$. It is noted that both are functionally equivalent, the diagram shown in FIG. 1 being used primarily for purposes of discussing the overall functional operation of the component 10, and FIG. 3 being a schematic diagram used in discussing the implementation of the integrated circuit component 10. Therefore, as shown in FIG. 3, an exemplary one of the selectors $20a-20d$, here selector $20a$, includes a diode matrix having as rows of conductors the "true" and "complement" lines $38a$, $42a$, $38b$, $42b$, $38c$, $42c$. The columns of conductors of the diode matrix of such selector $20a$ includes conductors $66_1-66_8$, such conductors $66_1-66_8$ being connected between the base electrodes of Schottky transistors $68_1-68_8$, respectively, as shown, and resistors $21_1-21_8$, respectively, as shown. The resistors $21_1-21_8$ are also coupled to the $+V_c$ pad via Schottky diode 69 as shown. The collector electrodes of Schottky transistors $68_1-68_8$ are connected to inverter $34a$ via conductor $70a$. (Likewise, selectors $20b-20d$ are connected to inverters $34b-34d$, via lines $70b-70d$, respectively, as shown.)

An exemplary one of the inverters $16a-16j$, here inverter $16a$, is shown to include a Schottky transistor 50 having its emitter electrode connected to input pad $I_0$, its base electrode coupled to the $+V_c$ pad through a resistor 52 and Schottky diode 54 and its collector electrode connected to the base electrode of Schottky transistor 56, as shown. Transistor 56 has its collector electrode connected to: (1) the $+V_c$ pad via resistor 58 and diode 54, and (2) the conductor $18a$ via Schottky diode 60, as shown. The emitter electrode of transistor 56 is coupled to the base electrode of transistor 64 and to the GND pad via resistor 62. The emitter electrode of transistor 64 is connected to the GND pad, and the collector electrode of transistor 64 is connected to conductor $18a$, as shown. In operation, when the signal on input pad $I_0$ is high (i.e., $\sim +5$ volts) or logical 1, transistor 50 turns off and transistors 56 and 64 turn on, thereby connecting conductor $18a$ to the ground pad GND. On the other hand, when the signal on input pad $I_0$ is low, or logical 0, transistor 50 turns on and transistors 56, 64 turn off, thereby coupling the $+V_c$ pad to conductor $18a$.

Inverter $34e$ includes a transistor 72 having its base electrode connected to enable pad $\overline{EN}$ and to the program enable circuit 30, as shown. Transistor 72 has its collector electrode connected to the $+V_c$ pad via resistor 74 and to the base of Schottky transistor 76, as shown. Transistor 76 has its collector electrode connected to $+V_c$ pad via resistor 78 and to the base electrode of transistor 80, as shown. The emitter electrode of transistor 76 is connected to the base electrode of Schottky transistor 82 via Schottky diode 84, as shown. Transistor 80 has its collector electrode connected to the $+V_c$ pad. The collector electrode of transistor 82 is connected to the emitter electrode of transistor 80 via diode 86 and Schottky diode 88, as shown. The collector electrode of such transistor 82 is also connected to the $+V_c$ pad via resistor 85 and to conductor 81, as shown. The emitter electrode of transistor 82 is connected to the ground pad GND, and the base electrode is connected to the ground pad GND via resistor 90, as shown. In operation, when the signal on enable pad $\overline{EN}$ is low or logical 0 (i.e., 0 to $+0.3$ volts), transistor 72 turns on, transistor 76 turns off, transistor 82 turns off, thereby coupling the $+V_c$ pad to conductor 81 to produce a high voltage on conductor 81. On the other hand, when the signal on enable pad $\overline{EN}$ is a logical 1 (i.e., $\sim +5$ volts), transistor 72 turns off and transistors 76, 82 turn on, thereby coupling conductor 81 to the ground pad GND to produce a low voltage on conductor 81.

Program enable circuit 30 includes a zener diode 92 (here a 20 volt zener diode) connected between the enable pad $\overline{EN}$ and conductor 96, as shown, and a resistor 94 connected between conductor 96 and the ground pad GND, as shown. In operation, when a logical signal (i.e., a logical 1 or a logical 0) is applied to enable pad $\overline{EN}$, the zener diode is off and the conductor 96 is electrically decoupled from enable signal pad $\overline{EN}$. During programming of the array 12, however, a very high positive voltage (greater than the zener diode 92 breakdown voltage), here +26 to +33 volts, is coupled to the enable pad $\overline{EN}$ thereby causing the zener diode 92 to operate, producing a +20 volt on conductor 96. As will be discussed hereinafter, such +20 volt level of voltage on conductor 96 enables inverters $34a$-$34d$ to pass current from output pads $O_1$-$O_4$ through decoders $20a$-$20d$ via conductors $70a$-$70d$ to selected ones of the coupling elements of array 12, such elements 14 being selected by the signals on input pads $I_0$-$I_9$ (for row selection) and control signal pads $S_0$-$S_2$ (for column selection), thereby enabling selected fusible links 22 (FIG. 1A) to "blow" to decouple selected diodes 23 (FIG. 1A) from their previously connected rows and columns of conductors $18a$-$18j$ and $19_1$-$19_{32}$.

An exemplary one of the inverters $34a$-$34d$, here inverter $34a$, is shown to include a clamp circuit 98 and a gate 100. Clamp circuit 98 includes a transistor 102 having its base electrode connected to the program enable circuit 30 via conductor 96 and resistor 104, as shown. The collector electrode is connected to: (1) the $+V_c$ pad through a Schottky diode 108 and a resistor 106, (2) the collector electrode of transistor 110 through Schottky diodes 108, 116, (3) the emitter electrode of transistor 102 via a pair of serially connected resistors 112, 114, and (4) the base electrode of transistor 110 through resistor 112, as shown. The emitter electrodes of transistors 102, 110 are connected to the ground pad GND. The collector electrode of transistor 110 is connected to selector $20a$ via conductor $70a$ and Schottky diode 117, as shown. Transistors 118, 124 have their collector electrodes connected together and to output pad $O_1$ via conductor $126a$, as shown. The base electrode of transistor 118 is connected to program enable circuit 30 via conductor 96 and resistor 120. The emitter electrode of transistor 118 is connected to the base electrode of such transistor through a diode 122 and to the base electrode of transistor 124, as shown. The emitter electrode of transistor 124 is connected to selector $20a$ via conductor $70a$, as shown. Gate 100 of inverter $34a$ includes a Schottky transistor 128 having its base electrode connected to inverter $34e$ via conductor 81 and diode 130, as shown. The base electrode of transistor 128 is also connected to selector $20a$ via conductor $70a$ and Schottky diode 131 and to the $+V_c$ pad via resistor 132, as shown. The collector electrode of transistor 128 is connected to the $+V_c$ pad via resistor 134 and the emitter electrode of such transistor 128 is connected to the base electrode of Schottky transistor 136 via Schottky diode 138, as shown. The base electrode of transistor 136 is connected to the emitter electrode of such transistor through a resistor 140. The collector electrode of transistor 136 is connected to the $+V_c$ pad via resistor 156. The emitter electrode of transistor 136 is connected to ground pad GND via resistor 142 and to the base electrode of Schottky transistor 144, as shown. The emitter electrode of transistor 144 is connected to ground pad GND and the collector electrode of such transistor 144 is connected to the emitter electrode of Schottky transistor 146 via Schottky diode 148 and to output pad $O_1$ via conductor $126a$. Transistor 146 has its base electrode connected to conductor 81 via Schottky diode 150, as shown, and its collector electrode connected to the $+V_c$ pad via resistor 152, as shown. It is noted that inverters $34b$-$34d$ are connected to output pads $O_2$-$O_4$, respectively, through conductors $126b$-$126d$, respectively, as shown.

In operation, the array 12 is programmed by coupling enable pad $\overline{EN}$ to a +26 to +33 volt supply (not shown), the ground of such supply being coupled to the ground pad GND. A suitable power supply (not shown) is connected to output pads $O_1$-$O_4$, one at a time, the positive potential of such supply being connected to such pads $O_1$-$O_4$, and the ground of such supply being coupled to the ground pad GND. The $+V_c$ power supply (not shown) is coupled between the $+V_c$ pad and the ground pad GND. As discussed, in response to this voltage on enable pad $\overline{EN}$, 20 volts is produced on conductor 96 by the program enable circuit. Transistors 102, 118 and 124 of clamp circuit 98 turn on and transistor 110 of such circuit 98 turns off. Likewise, transistors 128, 144 of gate 100 turn off to electrically decouple conductors $126a$-$126d$ from ground. Considering that the suitable supply (not shown) is first coupled to pads $O_1$, current from such supply passes from such pads $O_1$ to inverters $34a$, then to selector $20a$, then to the one of the transistors $68_1$-$68_8$ having base current supplied to it from the $+V_c$ supply, such one of the transistors $68_1$-$68_8$ being selected in accordance with the control signals supplied to selector $20a$ via decoder 26 and control pads $S_0$-$S_1$. The current then flows to the coupling element 14 which is connected to both: (1) the emitter electrode of the selected one of the transistors $68_1$-$68_8$, and (2) the one of the conductors $18a$-$18j$ which is connected to one of the inverters $16a$-$16j$ having a high or logical 1 signal fed thereto, the current from the supply which is coupled to output pad $O_1$ thereby "blowing" or open circuiting the fusible link through which such current flows. That is, if it is desired to open circuit the fusible link element 14 connected between conductor $18a$ and conductor $19_1$, element $14_S$, for example, the logical signals applied to control signal pads $S_0$-$S_2$ would be 0,0,0, respectively, and the logical signals on signal pads $I_0$-$I_9$ would be 1,0, - - - 0, respectively. Therefore in response to the control signals, high signals are produced on conductors $42a$, $42b$ and $42c$, and low signals are produced on conductors $38a$, $38b$, $38c$. In response to such signals, the diodes (not numbered) in selector $20a$ connected to conductors $66_2$-$66_8$ are forward biased, thereby electrically decoupling the base electrodes of transistors $68_2$-$68_8$ from the $+V_c$ pad, while the diodes (not numbered) in selector $20a$ which are connected to conductor $66_1$ are reverse biased to enable current from the $+V_c$ supply to pass to the base of transistor $68_1$. In response to the input signals on input pads $I_0$-$I_9$, inverter $16a$ couples conductor $18a$ to ground, and inverters $16b$-$16j$ couple conductors $18b$-$18j$ to the $+V_c$ supply, as discussed above. Therefore, in response to the control signals on control pads $S_0$-$S_2$ and the signals on input pads $I_0$-$I_9$, current passes from the supply coupled to output pad $O_1$, through conductor $126a$, transistors 124, 118, to conductor $70a$, then through transistor $68_1$ to conductor $19_1$, through the binary coupling element $14_S$ and finally to ground via "on" transistor 64, thereby open circuiting element $14_S$ to decouple conductors $18a$ and $19_1$. It is noted that, if the signal on pad $I_0$ were logical 0 instead of logical 1, current would not flow from conductor $18a$ to ground. It follows, then, that each one of the four sections of array 12 is similarly programmed by coupling the voltage supply to output pads $O_2$, $O_3$ and $O_4$, one at a time, while providing input pads $I_0$–$I_9$ and control pads $S_0$–$S_2$ with the desired row-column addressing signals.

When it is desired to operate the component 10 in its normal operating mode, a logical 0 (i.e., 0 to $\sim$0.3 volts) signal is applied to enable pad $\overline{EN}$. This electrically decouples conductor 96 from such pad $\overline{EN}$ and produces a high voltage on conductor 81, as discussed above. Therefore, transistors 118, 124 go off, transistor 102 goes off and transistor 110 goes on. Considering output pad $O_1$, for example, when a selected one of the columns of coupling elements is addressed, or selected, by selector 20a in response to control signals on control pads $S_0$–$S_2$, conductor 70a will become electrically coupled to, or electrically decoupled from, selected ones of inverters 16a–16j in accordance with the programmed array 12. For example, if the column of elements 14 which is connected to conductor $19_8$ is selected by signals 1,1,1 on pads $S_0$–$S_2$, and if all fusible links in such column have been "blown" or open circuited except for the one connected to conductor 18a (i.e., coupling element $14_R$), then the logical signals on input pads $I_1$–$I_9$ are decoupled from line 70a, and the signal on input pad $I_0$ is coupled to line 70a via: inverter 16a; coupling element $14_R$; and transistor $68_8$. In particular, if the signal on input pad $I_0$ is a logical 1, line 18a goes low and such low voltage (ground) is coupled to conductor 70a via coupling element $14_R$. In response to the low voltage diode 117 opens (i.e., becomes reverse biased) and diode 131 becomes forward biased, coupling a low voltage to the base of transistor 128 to turn such transistors 128, 136 and 144 off, whereby a high signal is produced at output pad $O_1$. If, however, the signal on input pad $I_0$ is logical 0, line 18a goes high, the collector of transistor $68_8$ tends to $+V_c$ but is limited here to $+2.8$ volts by clamp circuit 98 (i.e., diode 117 becomes forward biased), diode 131 becomes back biased and transistors 128, 136 and 144 are driven on by the high signal on conductor 81, producing a low signal on output pad $O_1$. Therefore, a signal on one of the input pads $I_0$–$I_9$ may be coupled to output pad $O_1$ when a fusible link is coupled to such input pad (via an inverter) and to the column conductors $19_1$–$19_8$ selected by selector 20a.

Figure 4:
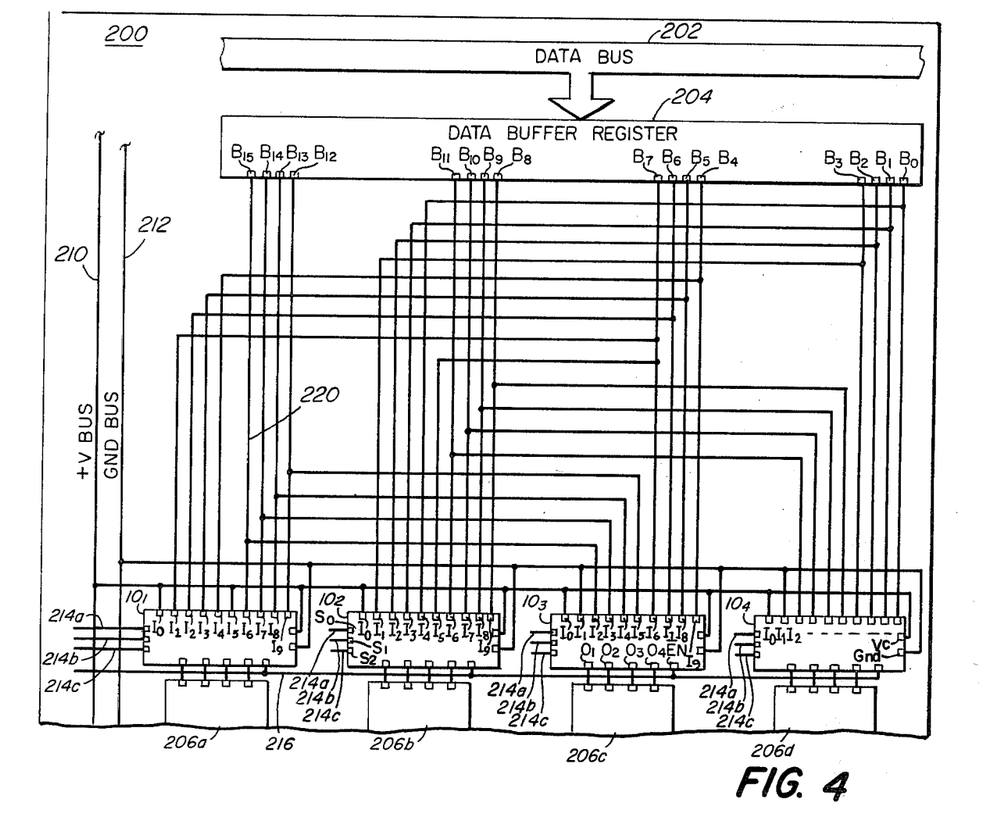
FIG. 4 is a diagram useful in understanding the integrated circuit component of FIG. 1.
Figure 5:
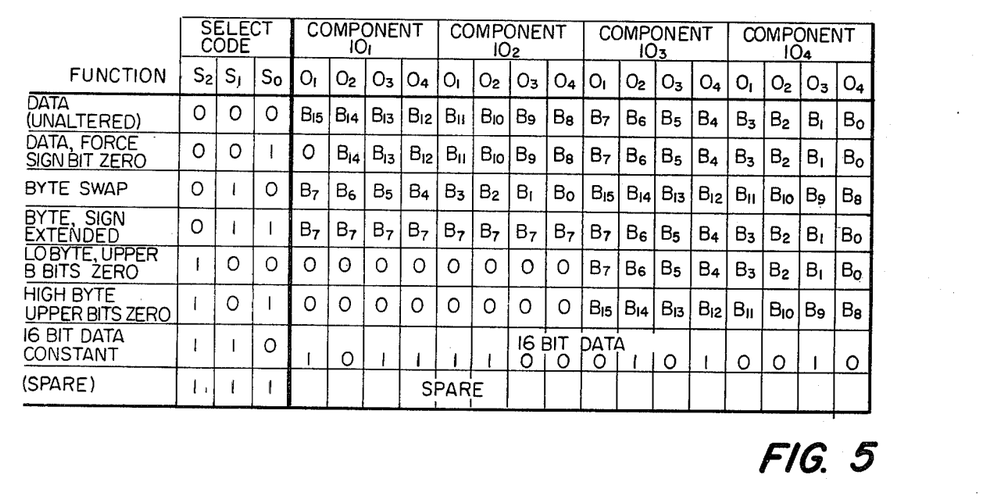
FIG. 5 is a table useful in understanding the diagram in FIG. 4.
Figure 6A:
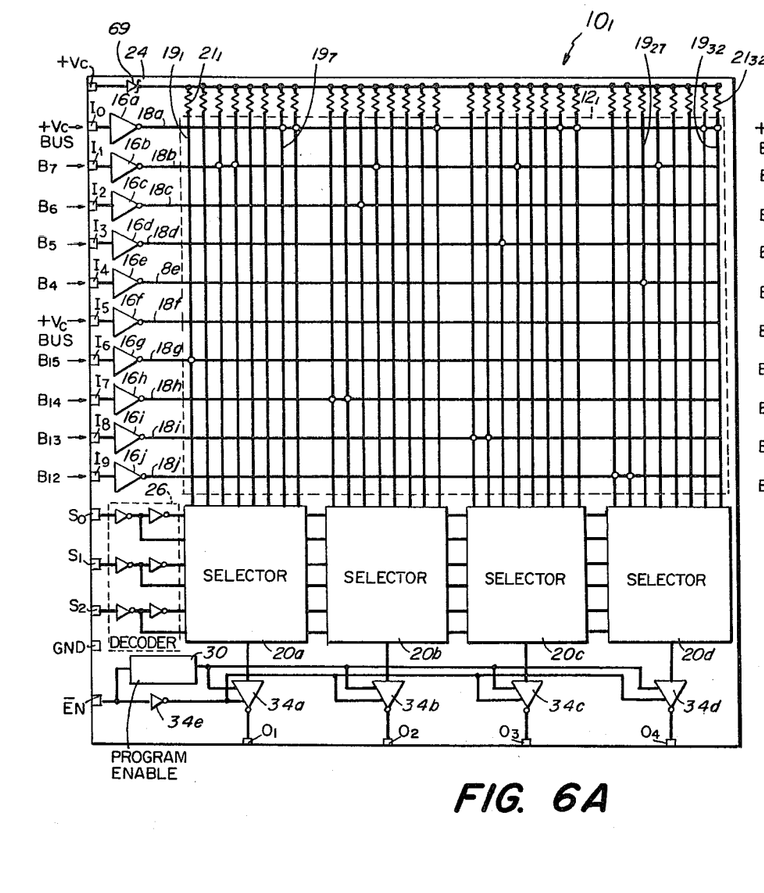
FIGS. 6A-6D are diagrams of integrated circuit components used in connection with FIG. 4.
Figure 6B:
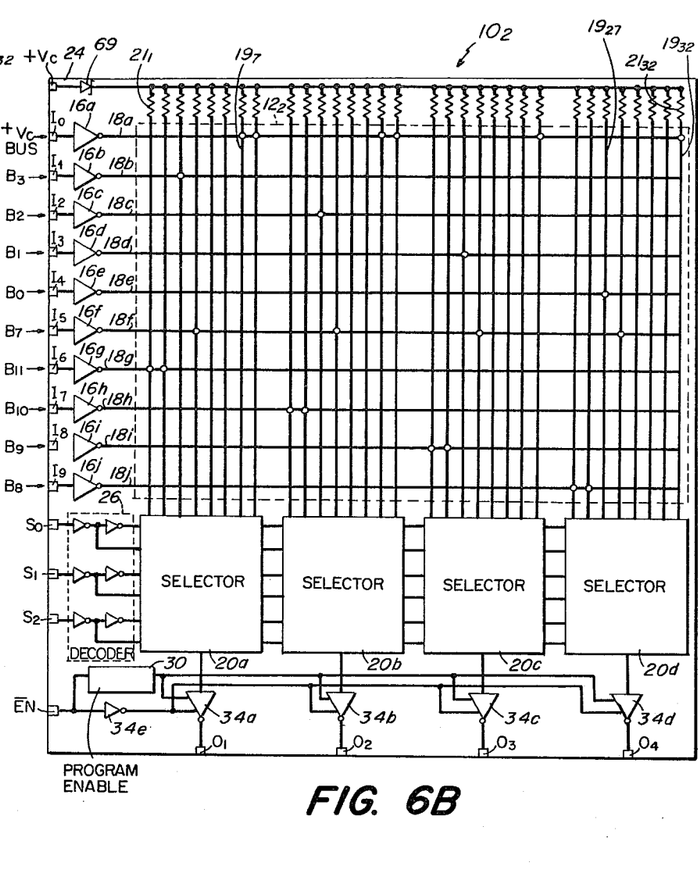
Figure 6C:
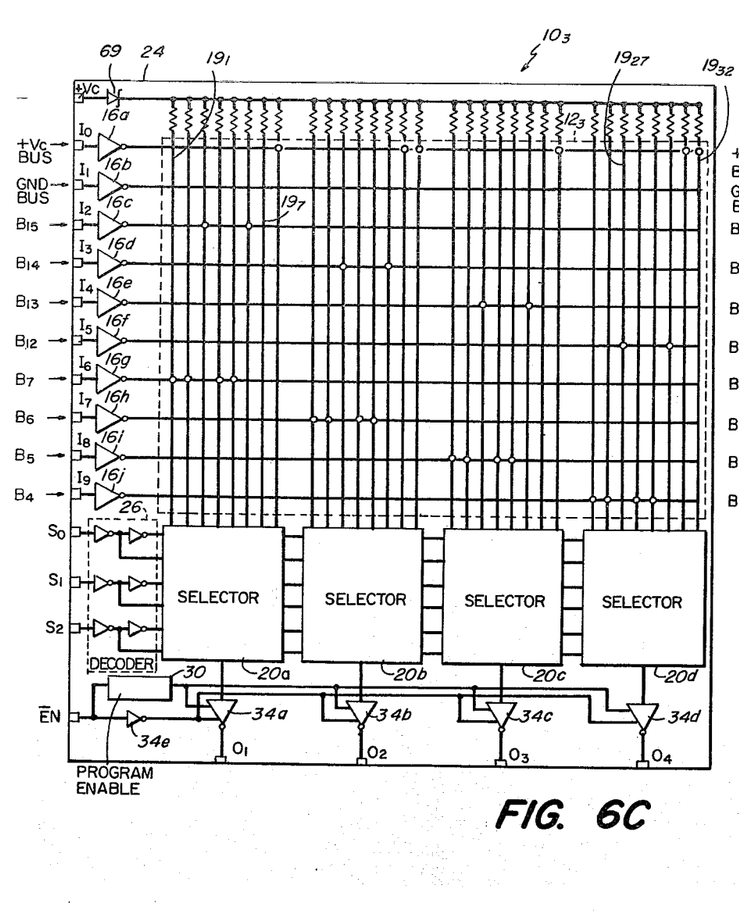
Figure 6D:
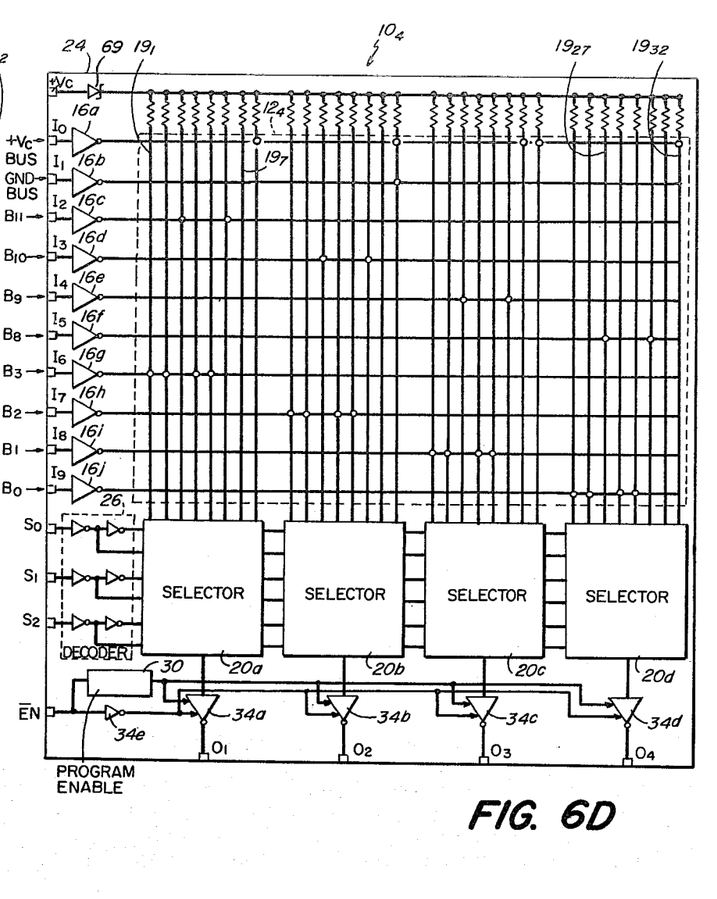

Referring now to FIG. 4, a printed circuit board 200 is shown to have a data bus 202 coupled to an integrated circuit component, here a 16-bit data buffer register 204. The printed circuit board 200 is wired to a plurality of, here four, integrated circuit components $10_1$, $10_2$, $10_3$, $10_4$, such components each being the integrated circuit component 10 described in connection with FIGS. 1 and 2, with the array 12 in each one of the components $10_1$, $10_2$, $10_3$, $10_4$ being programmed in the manner discussed above to couple data at output terminals $B_0$–$B_{15}$ of buffer register 204 to integrated circuit components 206a–206d, here conventional microprocessors, selectively in accordance with control signals supplied to control pads $S_0$–$S_2$ of such components $10_1$–$10_4$. The relationship between the control signals fed to control pads $S_0$–$S_2$ and the manner in which the data at terminals $B_0$–$B_{15}$ is to be coupled to components 206a–206d via output terminals $0_1$–$0_4$ of components $10_1$–$10_4$, respectively, is shown in FIG. 5. FIGS. 6A–6D show the integrated circuit components $10_1$–$10_4$, respectively, the arrays $12_1$–$12_4$ of such components $10_1$–$10_4$, respectively, having been programmed to implement the relationship shown in FIG. 5. Thus, for example, considering the relationship when the signals fed to control pads $S_0$–$S_2$ are 0,0,0, respectively, it is noted that the coupling elements 14 in column $19_1$ of of the components $10_1$–$10_4$ are selected. In component $10_1$ only conductor 18g is coupled to conductor $19_1$ by a coupling element, and therefore the signal on input pad $I_6$ becomes coupled to output pad $0_1$ of component $10_1$. Referring briefly to FIG. 4, it is noted that input pad $I_6$ of component $10_1$ is connected to port $B_{15}$ of register 204 by conductor 220 formed on the printed circuit board 200. Thus, in response to control signals $S_0$–$S_2$ of 0,0,0, terminal $B_{15}$ is coupled to output port $0_1$ of component $10_1$ as required by the relationship set forth in FIG. 5. Likewise, for components $10_2$–$10_4$, in response to such control signals, 0,0,0, on pads $S_0$–$S_2$, input pad $I_6$ of such components become coupled to output pads $0_1$ of such components, thereby coupling ports $B_{11}$, $B_7$ and $B_3$ to output pad $0_1$ of components $10_2$–$10_4$, respectively, as indicated in FIGS. 4, 5 and 6B–6D. Considering as another example the response of component $10_1$ to signals 0,0,1 on pads $S_2$, $S_1$, $S_0$, respectively, (i.e., "DATA, FORCE SIGN BIT ZERO" in FIG. 5), it is noted that selector 20a, in response to such signals, selects the coupling elements connected to conductor $19_2$. For component $10_1$ there are no coupling elements connected to such conductor $19_2$. Therefore, referring briefly to FIG. 3, the collector of transistor $68_1$ goes to $+V_c$ volts but is limited in voltage level by clamp circuit 98 to, here, $+2.8$ volts and, therefore, transistors 128, 136, 144 are driven on by the high voltage on conductor $18_1$, producing a low or logical 0 at output pad $O_1$ of component $10_1$ as required by the relationship set forth in FIG. 5. Component $10_2$, on the other hand, couples input pad $I_6$ to output pad $O_1$ of such component, thereby again coupling port $B_{11}$ to output pad $O_1$ of such component, as required by the relationship in FIG. 5. Considering now another one of the output pads $O_1$–$O_4$, say output pad $O_4$, when components $10_1$–$10_4$ respond to control signals 0,1,0 on control pads $S_0$–$S_2$, respectively, it is noted that such signals enable selector 20d to select the coupling elements 14 which are connected to columns $19_{27}$ of components $10_1$–$10_4$. Referring first to FIGS. 6A–6B, it is noted that, in response to such signals, input pads $I_4$, $I_4$, $I_5$ and $I_5$ are coupled to output pads $O_4$ of components $10_1$–$10_4$, respectively. Therefore, referring also to FIG. 4, in response to such control signals 0,1,0 and because of the wiring of the printed circuit board 200, ports $B_4$, $B_0$, $B_{12}$ and $B_8$ become coupled to output pads $O_4$ of components $10_1$–$10_4$, as required in the relationship shown in FIG. 5. Consider next the response of output pad $O_1$ of components $10_1$–$10_4$ to control signals 1,1,0 on control pads $S_2$, $S_1$, $S_0$, respectively (i.e., "16 bit data constant," FIG. 5). Such signals select the coupling elements connected to conductor $19_7$ of components $10_1$–$10_4$. Considering specifically component $10_1$, it is noted that, in response to such signals, input pad $I_0$ is coupled to output pad $O_1$. From FIG. 4 it is noted that input pad $I_0$ is connected to the $+V_c$ bus and, therefore, a logical 1 is produced at output pad $O_1$ as required by the relationship in FIG. 5.

Figure 7:
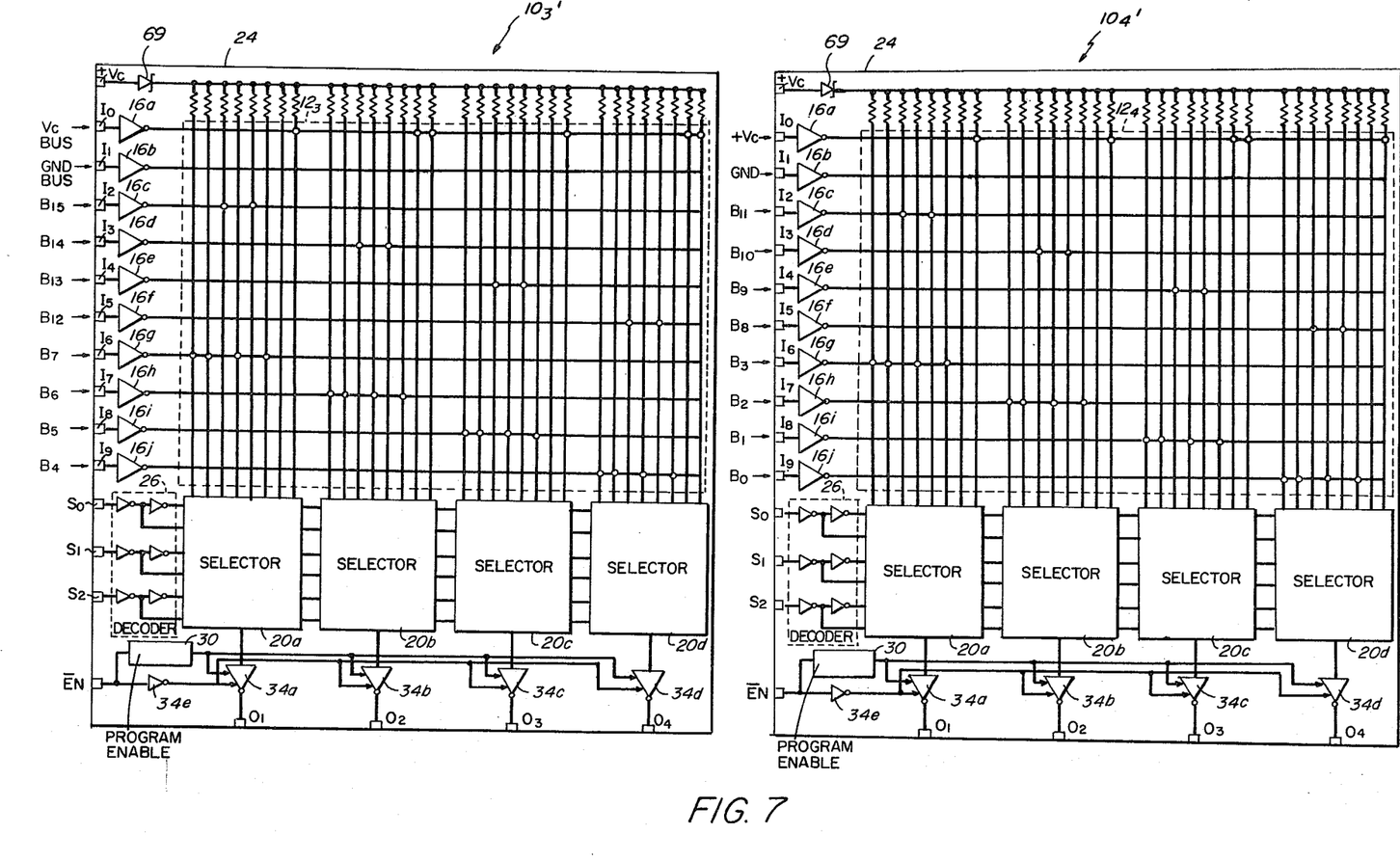
FIG. 7 shows diagrams of integrated circuit components used in connection with FIG. 4.

It should be noted that integrated circuit components 204, $10_1$–$10_4$ and 206a–206d are here adapted for insertion into conventional socket type connectors, not shown, such sockets being interconnected by the wiring formed on the printed circuit board 200. That is, the integrated circuit components are DIP packages. Therefore, if it is required to change the relationship between the signals on control pads $S_0$-$S_2$ (such signals being coupled to the components $10_1$-$10_4$ by wires 214a-214c) also formed on printed circuit board 200, and the coupling between ports $B_0$-$B_{15}$ and output pads $O_1$-$O_4$ of components $10_1$-$10_4$, such components $10_1$-$10_4$ will be replaced with appropriate differently programmed components 10 without rewiring the printed circuit board 200. Rather, the components which have to be changed are unplugged, and the new components are plugged into the then empty socket. For example, if the function "LO BYTE, UPPER 8 BITS ZERO" is to be performed in response to control signals 1,0,1 on control pads $S_2$, $S_1$, $S_0$, respectively, instead of in response to control signals 1,0,0, respectively, and if the function "HIGH BYTE→7-0, UPPER BITS ZERO" is to be performed in response to control signals 1,0,0 on control pads $S_2$, $S_1$, $S_0$, respectively, rather than control signals 1,0,1, respectively, components $10_3$, $10_4$ (FIGS. 6C, 6D) are replaced with components $10_3'$, $10_4'$, as shown in FIG. 7. In response to control signals 1,0,0 on control pads $S_2$, $S_1$, $S_0$, respectively, output pads $O_1$, $O_2$, $O_3$, $O_4$ of component $10_3'$ are coupled to input pads $I_2$, $I_3$, $I_4$ and $I_5$, thereby coupling such output pads $O_1$, $O_2$, $O_3$, $O_4$ to ports $B_{15}$, $B_{14}$, $B_{13}$ and $B_{12}$ and output pads $O_1$, $O_2$, $O_3$, $O_4$ of component $10_4'$ are coupled to input pads $I_2$, $I_3$, $I_4$, $I_5$, thereby coupling output pads $O_1$, $O_2$, $O_3$, $O_4$ to ports $B_{11}$, $B_{10}$, $B_9$, $B_8$ (i.e., "HIGH BYTE→7-0, UPPER BITS ZERO"). In response to control signals 1,0,1 on control pads $S_2$, $S_1$, $S_0$, respectively, ports $B_7$, $B_6$, $B_5$, $B_4$ become coupled to output pads $O_1$-$O_4$ of component $10_3'$, and ports $B_3$, $B_2$, $B_1$, $B_0$ become coupled to output pads $O_1$-$O_4$ of component $10_4'$ (i.e., "LO BYTE, UPPER 8 BITS ZERO"). It is noted that the integrated circuit component 10 is therefore an effective component for use in routing data between input pads $I_0$-$I_9$ and output pads $O_1$-$O_4$.

Figure 8:
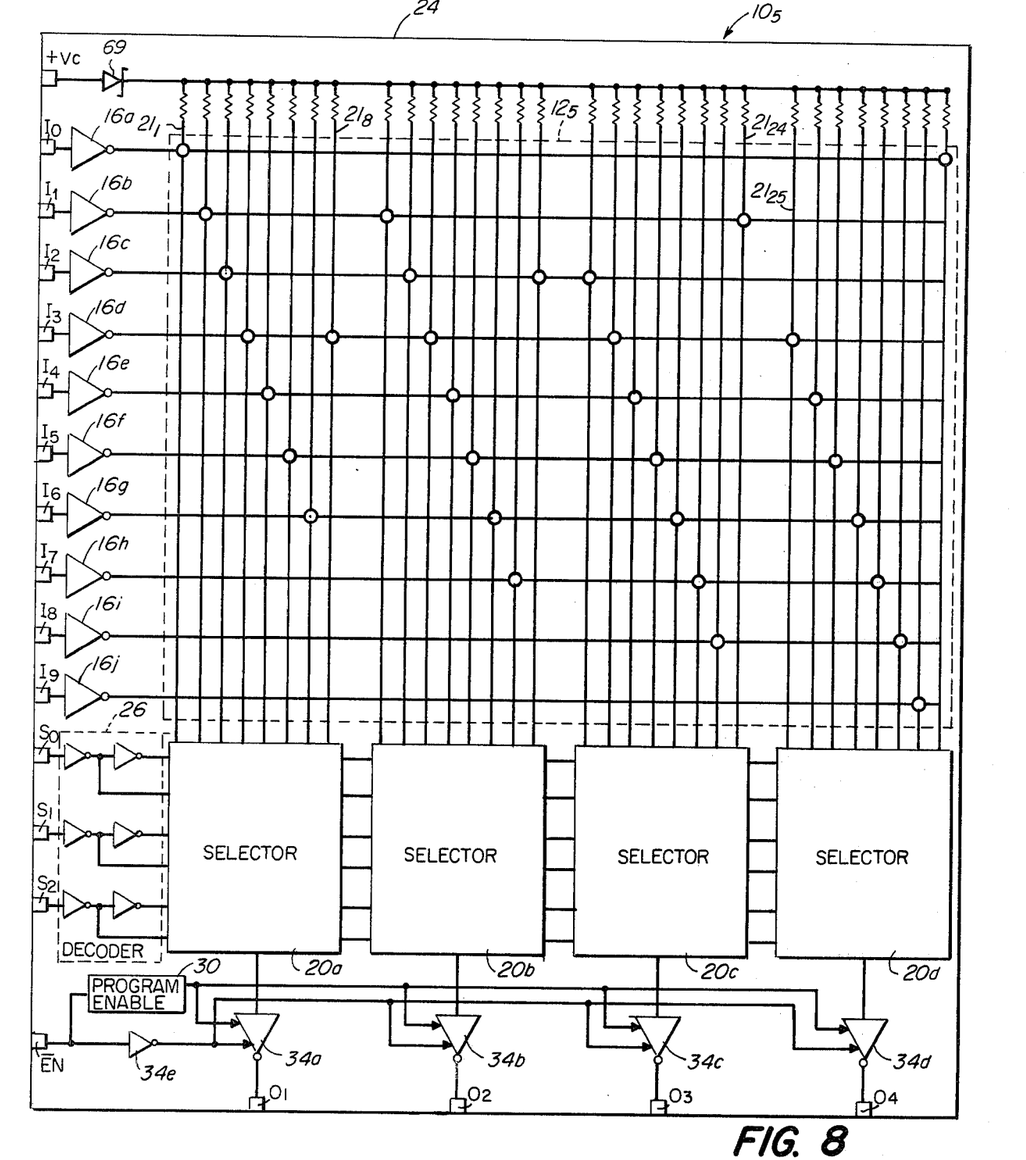
FIG. 8 is a diagram of an integrated circuit component according to the invention.

Referring now to FIG. 8, another example of the data routing effectiveness of integrated circuit component $10_5$ is shown. Here array $12_5$ has been programmed in accordance with the following relationship:

TABLE

| COUNT | CONTROL | | | OUTPUT | | | |
|---|---|---|---|---|---|---|---|
| | $S_2$ | $S_1$ | $S_0$ | $O_1$ | $O_2$ | $O_3$ | $O_4$ |
| $(0)_{10}$ | 0 | 0 | 0 | $I_0$ | $I_1$ | $I_2$ | $I_3$ |
| $(1)_{10}$ | 0 | 0 | 1 | $I_1$ | $I_2$ | $I_3$ | $I_4$ |
| $(2)_{10}$ | 0 | 1 | 0 | $I_2$ | $I_3$ | $I_4$ | $I_5$ |
| $(3)_{10}$ | 0 | 1 | 1 | $I_3$ | $I_4$ | $I_5$ | $I_6$ |
| $(4)_{10}$ | 1 | 0 | 0 | $I_4$ | $I_5$ | $I_6$ | $I_7$ |
| $(5)_{10}$ | 1 | 0 | 1 | $I_5$ | $I_6$ | $I_7$ | $I_8$ |
| $(6)_{10}$ | 1 | 1 | 0 | $I_6$ | $I_7$ | $I_8$ | $I_9$ |
| $(7)_{10}$ | 1 | 1 | 1 | $I_3$ | $I_2$ | $I_1$ | $I_0$ |

Figure 9:
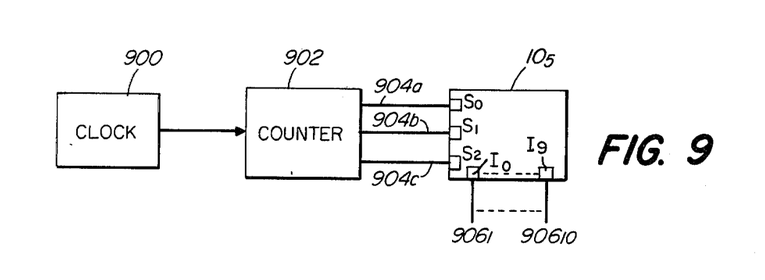
FIG. 9 is a diagram useful in understanding the integrated circuit component shown in FIG. 8.

Such component $10_5$ is programmed to operate as a so-called "shifter." That is, referring also to FIG. 9, a clock 900 is shown coupled to a three bit counter 902. Counter 902 is of conventional design and counts the clock pulses as they are fed thereto from clock 900. It follows then that the contents of counter 902 sequence through $(0)_{10}$-$(7)_{10}$ repetitively in response to the clock pulses. Counter 902 has three outputs 904a-904c coupled to control signal pads $S_0$-$S_2$ respectively, to produce control signals on such pads in response to the count of counter 900 as set forth in the Table above. Also coupled to component $10_5$ are ten lines $906_1$-$906_{10}$, such lines being coupled to input pads $I_0$-$I_9$, respectively. It follows then that, in operation, (and referring to the Table) as the clock operates, eight sets of four adjacent ones of lines $906_1$-$906_{10}$ become sequentially coupled to output pads $O_1$-$O_4$, such eight sets being: lines $906_1$-$906_4$; lines $906_2$-$906_5$; lines $906_3$-$906_6$; lines $906_4$-$906_7$; lines $906_5$-$906_8$; lines $906_6$-$906_9$; lines $906_7$-$906_{10}$ and lines $906_4$-$906_1$. It is noted that the last set is "opposite" in arrangement from the first set.

Having described preferred embodiments of the invention, it is evident that other embodiments incorporating these concepts may be used. For example, the size of the array 12 may be increased or decreased, with appropriate change in the number of input pads, output pads and selectors. Also, the programmable coupling elements may be avalanche induced migration devices. It is felt, therefore, that this invention should not be restricted to the disclosed embodiments, but rather should be limited only by the spirit and scope of the appended claims.

What is claimed is:

1. A circuit module adapted for removable connection to a plurality of input wires and an output wire to electrically interconnect a selected one of the plurality of input wires, each one being adapted to carry an independent logical signal to the output wire thereby to couple a selected one of such independent logical signals to such output wire, such circuit module comprising:
   (a) an array of conductors arranged in rows and columns;
   (b) a plurality of programmable coupling elements, each one being connected between different pairs of the rows and columns of conductors, each one of such elements being adapted to electrically connect or disconnect the pair of rows and columns of conductors connected to such element selectively in accordance with a programmed state of the element;
   (c) means, including a plurality of input terminals of such circuit module adapted for removable connection to the plurality of input wires, for electrically coupling each one of the independent logical signals to only one of the rows of conductors; and
   (d) selector means, including an output terminal of such circuit module adapted for removable connection to the output wire, for coupling one of the plurality of columns of conductors to the output terminal selectively in accordance with a control signal enabling only a selected one of the independent input signals to pass or be inhibited from passing to the output terminal selectively in accordance with the programmed state of the element.

2. A circuit module adapted for removable connection to a plurality of input wires and an output wire, each one of the plurality of input wires being adapted to carry an independent logical signal, such circuit module comprising:
   (a) an array of rows and columns of conductors;
   (b) a plurality of programmable coupling elements, each one being connected between different pairs of the rows and columns of conductors, each one of such plurality of programmable coupling elements being adapted to electrically connect or disconnect the pair of rows and columns of conductors connected to such element selectively in accordance with a programmed state of the element;
   (c) means, including a plurality of input terminals adapted for removable connection to the plurality of input wires, for electrically coupling each one of the independent logical signals to only one of the rows of conductors; and (d) selector means, including an output terminal of such circuit module adapted for removable connection to the output wire, for coupling a selected one of the plurality of conductors to the output terminal selectively in accordance with a control signal.

* * * * *

UNITED STATES PATENT OFFICE
CERTIFICATE OF CORRECTION

Patent No. 4,307,379　　　　　　　　Dated December 22, 1981

Inventor(s) David C. Wyland

It is certified that error appears in the above-identified patent and that said Letters Patent are hereby corrected as shown below:

Column 4, line 27, delete "tra" and replace with --tran--;

Column 8, line 3, insert --each-- between "of" and "of".

*Signed and Sealed this*

*Twenty-first* Day of *September 1982*

[SEAL]

*Attest:*

*Attesting Officer*　　　　　GERALD J. MOSSINGHOFF
　　　　　　　　　　　　　*Commissioner of Patents and Trademarks*